United States Patent [19]
Eichel

[11] Patent Number: 5,166,819
[45] Date of Patent: Nov. 24, 1992

[54] FRONT END FOR A BROADBAND OPTICAL RECEIVER

[75] Inventor: Manfred Eichel, Stuttgart, Fed. Rep. of Germany

[73] Assignee: Alcatel N.V., Amsterdam, Netherlands

[21] Appl. No.: 482,185

[22] Filed: Feb. 20, 1990

[30] Foreign Application Priority Data

Feb. 23, 1989 [DE] Fed. Rep. of Germany ....... 3905547

[51] Int. Cl.$^5$ .............................................. H04B 10/06
[52] U.S. Cl. ..................................... 359/189; 330/59; 250/214 A
[58] Field of Search ............... 455/619, 617, 606, 607; 330/59, 308; 250/214 A; 359/189, 154, 194

[56] References Cited

U.S. PATENT DOCUMENTS

| | | | |
|---|---|---|---|
| 3,902,060 | 8/1975 | Neuner et al. | 455/619 |
| 4,074,127 | 2/1978 | Mochida et al. | 455/619 |
| 4,567,446 | 1/1986 | Konishi | 330/338 |
| 4,792,997 | 12/1988 | Toussaint et al. | 455/619 |
| 4,792,998 | 12/1988 | Toussaint | 455/619 |
| 4,939,476 | 7/1990 | Crawford | 330/59 |

FOREIGN PATENT DOCUMENTS

| | | |
|---|---|---|
| 3264989 | 11/1989 | Australia . |
| 0129305 | 12/1984 | European Pat. Off. . |
| 0181146 | 5/1986 | European Pat. Off. . |
| 0262728 | 4/1988 | European Pat. Off. . |
| 54-34791 | 3/1979 | Japan .......... 455/619 |

OTHER PUBLICATIONS

C. Baack, "Optical Wideband Transmission Systems", CRC Press, Inc., Boca Raton, FLA, 1986 (pp. 120–125).
M. Weik, "Communications Standard Dictionary", pp. 684 & 685, Van Nostrand Reinhold Co., N.Y., 1983.
Avantek, "AN-S011: Using Silicon MMIC Gain Blocks as Transimpedance Amplifiers", Santa Clara, CA, Dec. 1989.
"Low-Noise High-Speed Optical Receiver for Fiber Optic Systems", IEE Journal of Solid-State Circuits, vol. SC-19, No. 1, Feb. 1984, pp. 155–157 A. Arbel, et al.
"Optical Fiber Technology Detectors and Receivers", Electrical Communication, vol. 56, No. 4, 1981, pp. 349–357, G. Antell, et al.
B. Bentland, "A 2.4 Bg/s fiber-optic receiver . . . ", Elsevier Science Publishers B.V., Optics Comm., Amsterdam, NL, Oct. 1986, pp. 349–353.
Avantek specification sheet for MSA-0200 Amplifiers, undated.
Avantek specification sheet for MSA-0800 Amplifiers, undated.
G. Antell et al; "Detectors and Receivers"; *Electrical Communications* vol. 56 No. 4 (1981).
J. Geisler et al; *Optical Fibers* (EPO Applied Technology Series vol. 5); Chapter III (pp. 446–447, 454–455, 460) Pergamon Press 1986.
MAR Serie; 145 page Data sheet for "MAR-Verstärker DC-2 GHz"; Industrie-Electronics GmbH, Frankfurt.

Primary Examiner—Edward L. Coles, Sr.
Assistant Examiner—Kinfe-Michael Negash
Attorney, Agent, or Firm—Brunell & May

[57] ABSTRACT

A front end for a broadband optical receiver is disclosed which includes a monolithic integrated Darlington circuit with bipolar transistors (T1, T2). This Darlington circuit is a simple integrated amplifier (OP) developed for UHF application in the range between 0 and 2 GHz. By connecting a suitable transimpedance resistor ($R_T$) across the Darlington circuit, an improvement in linearity is obtained such that the Darlington circuit can be used together with an avalanche photodiode (APD) in the 0- to 5-GHz frequency range, and together with PIN diodes in short-and medium-length optical tansmission links.

13 Claims, 1 Drawing Sheet

FRONT END FOR A BROADBAND OPTICAL RECEIVER

TECHNICAL FIELD

The present invention relates to a front end for a broadband optical receiver.

CLAIM FOR PRIORITY

This application is based on and claims priority from an application first filed in Fed. Rep. Germany on 23 Feb. 1989 under U.S. patent Ser. No. 38 05 547.7. To the extend such prior application may contain any additional information that might be of any assistance in the use and understanding of the invention claimed herein, it is hereby incorporated by reference.

BACKGROUND ART

In prior art front ends for a broadband optical receiver preamplifiers are typically used together with, e.g., PIN or avalanche photodiodes to convert high-frequency optical signals transmitted over optical waveguides into electric signals suitable for demodulation.

An outline of commonly used front ends equipped with PIN photodiodes or avalanche photodiodes (APD) is contained, for example, in "EPO Applied Technology Series Vol. 5", entitled "Optical Fibres", Chapter III, pp. 446 et seq.

With such front ends, substantially linear and high gain, which requires a good signal-to-noise ratio, is to be achieved over as wide a frequency range as possible.

The best results have so far been achieved with avalanche photodiodes in conjunction with preamplifiers using a gallium arsenide field-effect transistor (GaAs-FET) as the front end and designed as transimpedance amplifiers. However, avalanche photodiodes are still very expensive compared with PIN diodes, and field-effect transistors, particularly low-capacitance GaAs field-effect transistors, generate high so-called 1/f noise in the low frequency range. This noise affects, for example, the transmission of additional low-frequency signals or the transmission of analog signals.

As indicated in "Electrical Communication", Vol. 56, No. 4, 1981, page 356, section entitled "Schlußbetrachtungen", progress toward improving optical receiver performance was expected mainly of the development of improved avalanche photodiodes and the integration of detector and subsequent field-effect transistor (PIN-FET approach).

The first-mentioned reference also shows preamplifiers using bipolar transistors and avalanche photodiodes which are claimed to have reached data rates of 500 Mb/s (p. 455, FIG. 3.32) and 1.12 Gb/s (p. 460, FIG. 3.4). The reference gives no details of the implementation and cost of the circuits shown.

DISCLOSURE OF INVENTION

It is the object of the invention to provide a front end for a broadband optical receiver which has low noise, exhibits good gain and phase linearity over as wide a bandwidth as possible and at the highest possible gain, and can be manufactured at low cost.

The invention makes it possible to construct high-performance front ends for optical receivers using simple, low-cost, commercially available integrated circuits. A Darlington circuit for the UHF range using bipolar transistors which is suitable for implementing a front end in accordance with the invention is known, for example, from the printed publication "MAR-Verstärker, DC-2 GHz" of Industrie-Electronics GmbH, Frankfurt. As was determined by experiments, the connection of a suitable transimpedance resistor across this circuit makes it possible to improve the linearity of the circuit to the point that it can be used together with an avalanche photodiode in the frequency range from 0 to 5 GHz and then outperforms conventional GaAs-FET circuits in terms of gain and signal-to-noise ratio. The use of bipolar transistors instead of field-effect transistors also eliminates the 1/f noise in the low frequency range, so that it is possible, for example, to additionally transmit optical telemetering signals in the low-frequency range. Even if low-cost PIN diodes are used instead of avalanche photodiodes, the front end according to the invention affords high gain and good linearity and is thus suitable for use in short- and medium-length optical transmission links.

Further advantageous features of the front end according to the invention relate to the design of the integrated Darlington circuit, to the value to be chosen for the transimpedance resistor, and to the coupling of the light detector to the preamplifier.

BEST MODE FOR CARRYING OUT THE INVENTION

Figure 1:
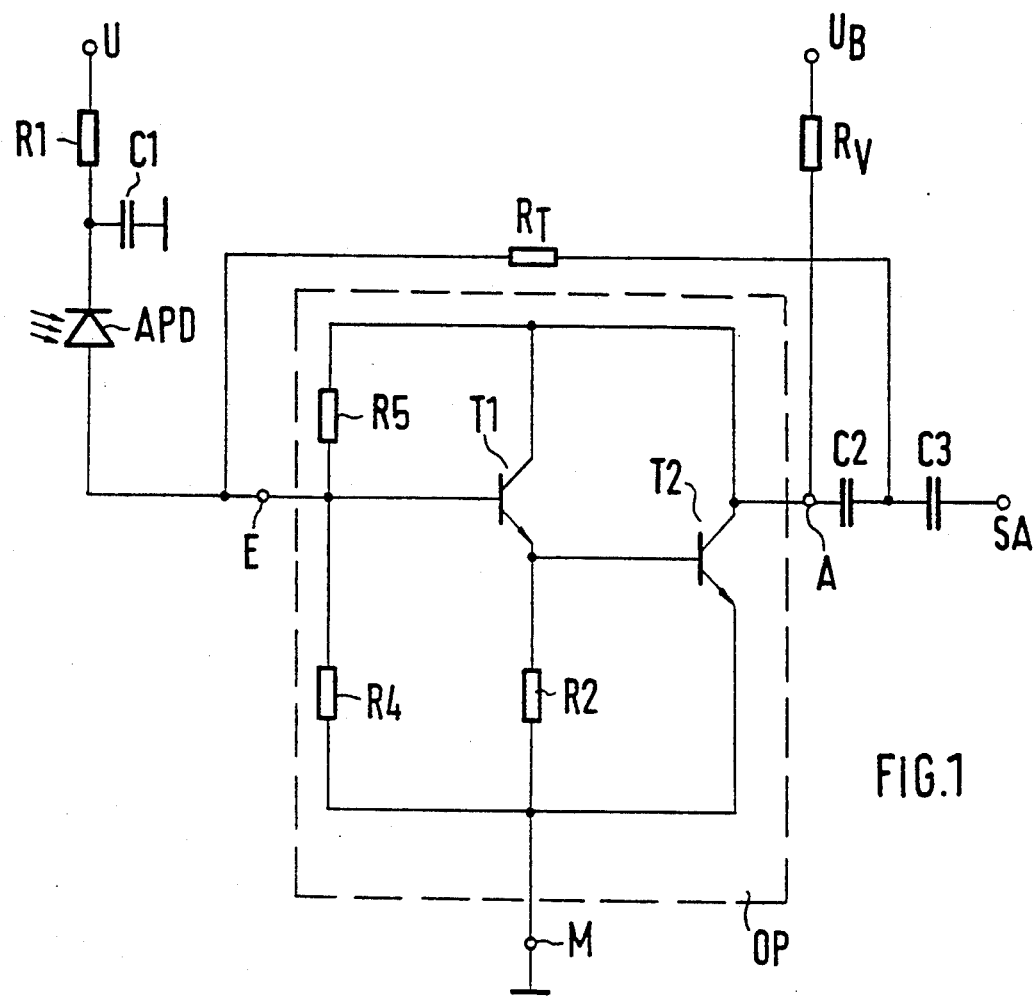
FIG. 1 shows an embodiment of the front end according to the invention which uses an avalanche photodiode APD) or a PIN diode together with the integrated Darlington circuit "MAR 8", described in the printed publication referred to above.

In FIG. 1, an avalanche photodiode (APD) has its cathode connected through a series resistor R1 to a positive supply-voltage terminal U (opposite pole grounded) whose voltage level is adapted to the detector used. A grounded capacitor C1 establishes the RF short-circuit required at the cathode end to operate the APD. The anode of the APD is connected directly to the input E of an integrated amplifier OP having an output terminal A and a ground terminal M and including two Darlington-connected bipolar transistors T1 and T2. The operating point of the integrated amplifier is determined by its internal resister network. The latter consists of a grounded emitter resistor R2 of the transistor T1 and a high-resistance voltage divider at the input end consisting of a grounded base resistor R4 of the first transistor T1 and a resistor R5 which has one end connected to positive potential, i.e., to the collector of the second transistor T2, which forms the output A of the integrated amplifier. The center tap of the voltage divider is connected to the base of the first transistor T1 and constitutes the input E of the integrated amplifier circuit. The integrated amplifier is fed from a supply-voltage source $U_B$, whose DC voltage is applied through a series resistor $R_V$ to its output A with respect to ground.

The circuit of FIG. 1 further includes a transimpedance resistor $R_T$, which connects the input E of the integrated amplifier OP to the output of the latter and to the output SA of the entire front end to provide a path for alternating current. Via capacitors C2 and C3, the transimpedance resistor is DC-isolated both from the output A of the integrated amplifier and from the circuit output SA. Such isolation may also be provided from the input E of the integrated amplifier.

The transimpedance resistor $R_T$ has a value of between 100 and 1500 ohms, e.g., 750 ohms and is thus much smaller than the resistor R5 in the integrated amplifier, which has a value of about 10 kohms and only serves to set the operating point of the integrated amplifier.

It is only due to the resistor $R_T$ that the integrated amplifier takes on the typical features of a transimpedance amplifier, such as linear gain over a wide frequency range and low noise.

FIG. 2 shows two ways of coupling the optical detector APD to the integrated amplifier OP.

Figure 2A:
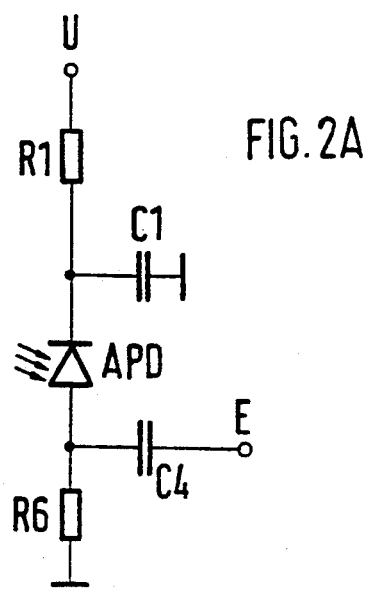
FIG. 2A-2B show two further ways of coupling the light detector to the preamplifier.

In FIG. 2a, unlike in FIG. 1, the anode of the detector APD is coupled to the input E of the integrated amplifier (not shown) via a capacitor C4. In order that DC voltage is applied to the APD, the anode of the latter is additionally grounded through a resistor R6.

Figure 2B:
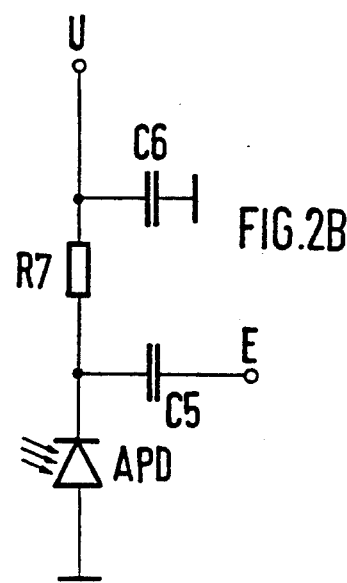

In FIG. 2b, the anode of the APD is grounded directly. The input E of the integrated amplifier is coupled to the cathode of the APD via a capacitor C5. The signal to be processed by the integrated amplifier is therefore inverted with respect to the signal applied to the integrated amplifier in the circuits of FIGS. 1 and 2a. The supply voltage is applied through a series resistor R7. The RF short-circuit by a grounded capacitor C6 is located between the series resistor and the supply-voltage terminal U.

The gain achieved with the circuit of FIG. 1 is so high that an incident light level as low as $-32.5$ dBm suffices to ensure a bit error rate of $10^{-9}$ over a 3-dB bandwidth of 2.4 GHz with good linearity. The noise level is low (approx. 3.5 dB) over the entire frequency range.

If the APD is replaced by a low-cost PIN diode, an incident light level of $-20$ dBm is required to achieve the above values.

I claim:

1. Front end for a broadband optical receiver, comprising
    a light detector,
    a monolithic integrated preamplifier circuit following said light detector and constructed from at least two Darlington-connected bipolar transistors with a control electrode of the first Darlington-connected bipolar transistor functioning as a preamplifier input and an output electrode of the last Darlington-connected bipolar transistor functioning as a preamplifier output, and
    a transimpedance resistor having a value between 100 ohms and 1500 ohms coupled between said preamplifier input and said preamplifier output.

2. A front end as claimed in claim 1 wherein said transimpedance resistor is capacitively coupled between said preamplifier input and said preamplifier output.

3. A front end as claimed in claim 1 wherein the light detector is a diode having an anode connected directly to the input of the preamplifier.

4. A front end as claimed in claim 1, wherein the light detector is a diode having an anode capacitively coupled to the input of the preamplifier, said anode being grounded through a resistor.

5. A front end as claimed in claim 1 wherein the light detector is a diode having an anode which is grounded, and a cathode which is capacitively coupled to the input of the preamplifier, said cathode being connected through a resistor to a supply voltage.

6. A front end as claimed in claim 1 wherein the light detector is an avalanche photodiode.

7. A front end as claimed in claim 1 wherein the light detector is a PIN diode.

8. A front end as claimed in claim 1 wherein said transimpedance resistor is a low-valued resistance not substantially greater than 750 ohms.

9. A front end as claimed in claim 8 wherein said low-valued resistance is substantially equal to 750 ohms.

10. Front end for a broadband optical receiver, comprising
    a light detector,
    a monolithic integrated preamplifier circuit following said light detector and constructed from at least two Darlington-connected bipolar transistors with a control electrode of the first Darlington-connected bipolar transistor functioning as a preamplifier input and an output electrode of the last Darlington-connected bipolar transistor functioning as a preamplifier output,
    a voltage divider network for setting the operating point of the integrated preamplifier including a voltage divider resistance directly coupled between the preamplifier input and the preamplifier output, and
    transimpedance resistor having a value substantially smaller than that of the voltage divider resistance and capacitively coupled between said preamplifier input and said preamplifier output.

11. A front end as claimed in claim 10 wherein said voltage divider resistance has a value on the order of 10 kohms and said transimpedance resistor has a value between 100 ohms and 1500 ohms.

12. A front end as claimed in claim 11 wherein said transimpedance resistor has a value on the order of 750 ohms.

13. A front end as claimed in claim 10 wherein the ratio of the value of said transimpedance resistor relative to that of said voltage divider resistance is between 1/100 and 15/100.

* * * * *